US010438919B1

(12) United States Patent
Watson et al.

(10) Patent No.: US 10,438,919 B1
(45) Date of Patent: Oct. 8, 2019

(54) PASSIVE HYDRAULIC LOAD LEVELER FOR THERMAL COMPRESSION BONDING

(71) Applicant: NORTHROP GRUMMAN SYSTEMS CORPORATION, Falls Church, VA (US)

(72) Inventors: Victor J. Watson, Rancho Palos Verdes, CA (US); Chunbo Zhang, Manhattan Beach, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 490 days.

(21) Appl. No.: 15/195,487

(22) Filed: Jun. 28, 2016

(51) Int. Cl.
B32B 37/00 (2006.01)
H01L 23/00 (2006.01)
B30B 15/34 (2006.01)
B30B 1/34 (2006.01)
B30B 15/24 (2006.01)

(52) U.S. Cl.
CPC ............. *H01L 24/75* (2013.01); *B30B 1/34* (2013.01); *B30B 15/24* (2013.01); *B30B 15/34* (2013.01); *H01L 2224/753* (2013.01); *H01L 2224/7555* (2013.01); *H01L 2224/75703* (2013.01); *H01L 2924/14* (2013.01)

(58) Field of Classification Search
USPC ............... 156/580, 583.1; 100/258 R, 258 A
See application file for complete search history.

(56) References Cited

U.S. PATENT DOCUMENTS

| 2,302,132 | A | 11/1942 | MacMillin et al. |
| 3,682,465 | A | 8/1972 | Hänni |
| 4,128,376 | A | 12/1978 | Albertazzi |
| 4,576,092 | A | 3/1986 | Yamato |
| 5,067,340 | A | * 11/1991 | MacGregor .......... B21D 5/0272 100/258 A |
| 5,517,910 | A | 5/1996 | Skahan |
| 5,735,201 | A | 4/1998 | Hirao et al. |
| 5,858,422 | A | 1/1999 | Brams |
| 6,526,879 | B1 | * 3/2003 | Mahoney .................. B30B 1/34 100/258 A |

(Continued)

FOREIGN PATENT DOCUMENTS

| DE | 199 37 694 A1 | 2/2001 |
| DE | 100 43 030 A1 | 3/2002 |

(Continued)

*Primary Examiner* — James D Sells
(74) *Attorney, Agent, or Firm* — John A. Miller; Shumaker, Loop & Kendrick, LLP

(57) ABSTRACT

A press including a passive load leveler for bonding integrated circuit wafers, chips or substrates. The press includes a press frame, a press ram moveable relative to the frame, a first platen coupled to the press ram, and a second platen coupled to the press frame. The load leveler is coupled between the press frame and the second platen, and includes a main body having a first surface coupled to the press frame a plurality of pistons extending from the main body through a second surface and being in contact with the second platen. Each of the pistons is positioned within a piston chamber that is in fluid communication with a network of channels within the main body, where the pistons move relative to each other through a working fluid within the channels so as to maintain the first and second platens parallel to each other under the ram pressure.

19 Claims, 2 Drawing Sheets

(56) References Cited

U.S. PATENT DOCUMENTS

| | | |
|---|---|---|
| 6,752,901 B2 | 6/2004 | Müsse |
| 7,165,957 B2 | 1/2007 | Montelius et al. |
| 7,196,290 B2 * | 3/2007 | Oliver ................. B29C 65/7864 |
| | | 100/319 |
| 7,204,686 B2 | 4/2007 | Chung et al. |
| 7,764,076 B2 | 7/2010 | Di Stefano et al. |
| 7,896,046 B2 | 3/2011 | Park |
| 8,042,593 B2 | 10/2011 | Yoon et al. |
| 8,261,803 B2 | 9/2012 | Espe |
| 8,469,074 B2 | 6/2013 | Ko |
| 8,794,287 B2 | 8/2014 | Izumi |

FOREIGN PATENT DOCUMENTS

| | | |
|---|---|---|
| JP | 2007-301593 A | 11/2007 |
| WO | WO 2009/084536 A1 | 7/2009 |

* cited by examiner

PASSIVE HYDRAULIC LOAD LEVELER FOR THERMAL COMPRESSION BONDING

BACKGROUND

Field

This invention relates generally to a press for bonding two or more wafers to provide hermetically sealed and electrically connected stacked integrated circuit chips and, more particularly, to a passive load leveler employed in a press for bonding two or more wafers to provide hermetically sealed and electrically connected stacked integrated circuit chips, where the load leveler includes independently positionable pistons that allow the wafers to remain parallel relative to each other under the load of the press.

Discussion

Wafer-level packaging (WLP) of integrated circuits, such as monolithic millimeter-wave integrated circuits (MMIC), is well known. Many integrated circuits are typically fabricated on a semiconductor wafer and each separate integrated circuit can be surrounded by a ring of bonding materials. Two such wafers can be aligned and pressed together under a certain pressure and temperature to achieve wafer bonding along the ring. For some bonding (e.g. Au to Au thermocompression bonding), high bonding pressures and therefore high bonding forces are required to achieve desirable compression and sealing, while at the suitable high bonding temperatures. For example, because a typical wafer has a 3.938" diameter, approximately 15 tons of pressure is required to bond the wafers. Typical commercial bonders (such as EVG bonders) generally use bonding forces of no more than 100 kN. It is sometimes desirable to use more than 100 kN bonding force at high temperature to achieve good hermetic sealing.

Because of the size of the wafers and the pressure requirements for bonding, significant constraints on the flatness and parallel requirements of the platens of the press is necessary, where extreme precision is required. More particularly, at the required pressures it is difficult for the heated press platens to remain within the flatness and parallel constraints required. In actual practice, the press platens and the press frame deform to a degree that would not allow sufficient yield of packaged chips to make the process cost effective. In other words, because of the flatness and parallel constraints, a significant portion of the chips in the wafers would not be properly bonded and sealed. It is known in the art to provide a ball and socket joint in a press to allow the platen surfaces to better align, however, this creates a situation where the more pressure that is applied, deformation of the press and platens would increase and would fail to provide the sensitive and precise alignment needed to thermally bond the wafers.

DETAILED DESCRIPTION OF THE EMBODIMENTS

The following discussion of the embodiments of the invention directed to a wafer press including a passive load leveler for bonding two integrated circuit wafers is merely exemplary in nature, and is in no way intended to limit the invention or its applications or uses.

Figure 1:
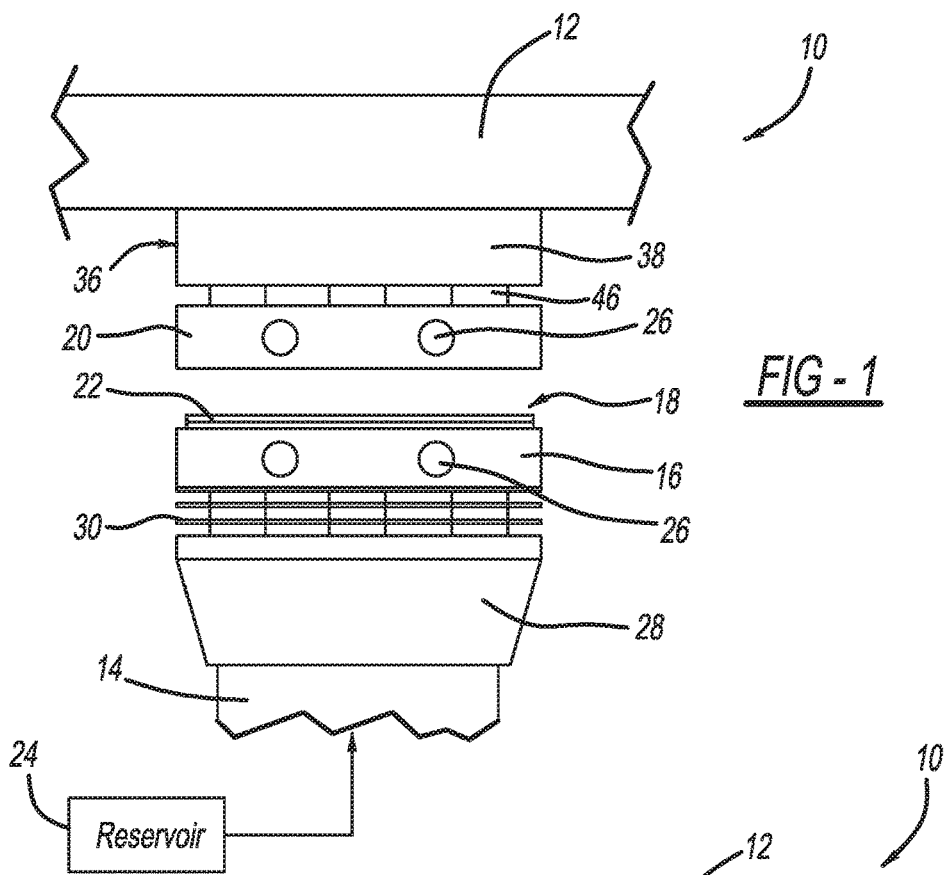
FIG. 1 is a cut-away side view of a wafer press in an open position, and including a passive load leveler.
Figure 2:
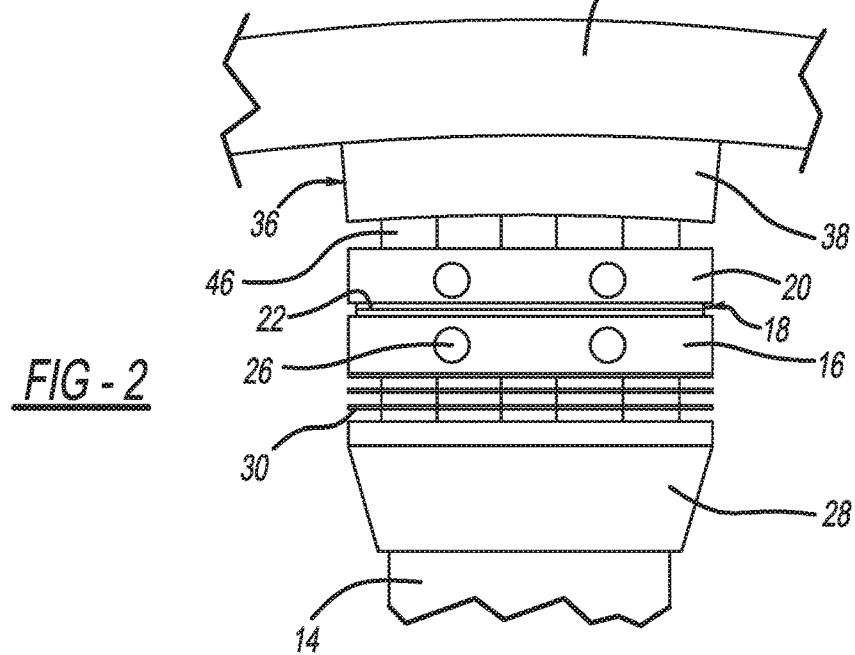
FIG. 2 is a cut-away side view of the press shown in FIG. 1 in a closed position.

FIG. 1 is a cut-away side view of a wafer press 10 in an open position and FIG. 2 is a cut-away side view of the press 10 in a closed position. The press 10 includes a ridged press frame 12 at an upper end and a press ram 14 at a lower end, where the press ram 14 is moveable under, for example, hydraulic pressure to open and close the press 10. The press 10 includes a lower platen 16 to which a bonding assembly 18 is mounted and an upper platen 20. The bonding assembly 18 is intended to represent two or more integrated circuit wafers, chips or substrates that are already aligned and pre-bonded under low force, or a dedicated fixture that holds two or more aligned integrated circuit wafers, chips or substrates to be bonded together. For example, the wafers, chips or substrates can be aligned in aligner and dedicated fixture, then positioned on the platen 16 for the final bonding at high force to achieve hermetic sealing. In this non-limiting embodiment, the bonding assembly 18 includes two integrated circuit wafers 22. The bonding assembly 18 could include disks (not shown) to help distribute the force during bonding process.

Both of the platens 16 and 20 are heated by, for example, cartridge heaters 26 so as to heat the bonding rings (not shown) that seal the wafers 22 in the bonding assembly 18 together. As mentioned above, bonding rings (e.g., gold bonding rings) surround the integrated circuits (not shown) provided on the wafers 22 in the bonding assembly 18 that are already aligned to each other. The bonding rings bond together under the pressure and heat provided by the press 10 so as to hermetically seal the integrated circuits within. Once the wafers in the bonding assembly 18 are bonded together, the individual chips are separated therefrom by sawing through both of the wafers in the wafer assembly 18 between individual chips. The lower platen 16 is rigidly mounted to a base portion 28 that is secured to the press ram 14, where a thermal insulator 30 is provided between the lower platen 16 and the base portion 28 so as to thermally isolate the press ram 14 from the platen 16. The ram 14 receives a hydraulic fluid from a reservoir 24, where an external force or pressure can be applied through the hydraulic fluid to move the ram 14.

When the press ram 14 moves upward to close the gap between the platens 16 and 20 and bond the aligned wafers 22 in the bonding assembly 18, a significant amount of force pushes up against the press frame 12, shown as an exaggerated deformation of the frame 12 in FIG. 2. In order to maintain the contact area between the wafers 22 in the bonding assembly 18 completely parallel and flat within the tolerances required to seal all of the bonding rings in the wafers 22 together, a passive load leveler 36 is provided between the press frame 12 and the upper platen 20.

Figure 3:
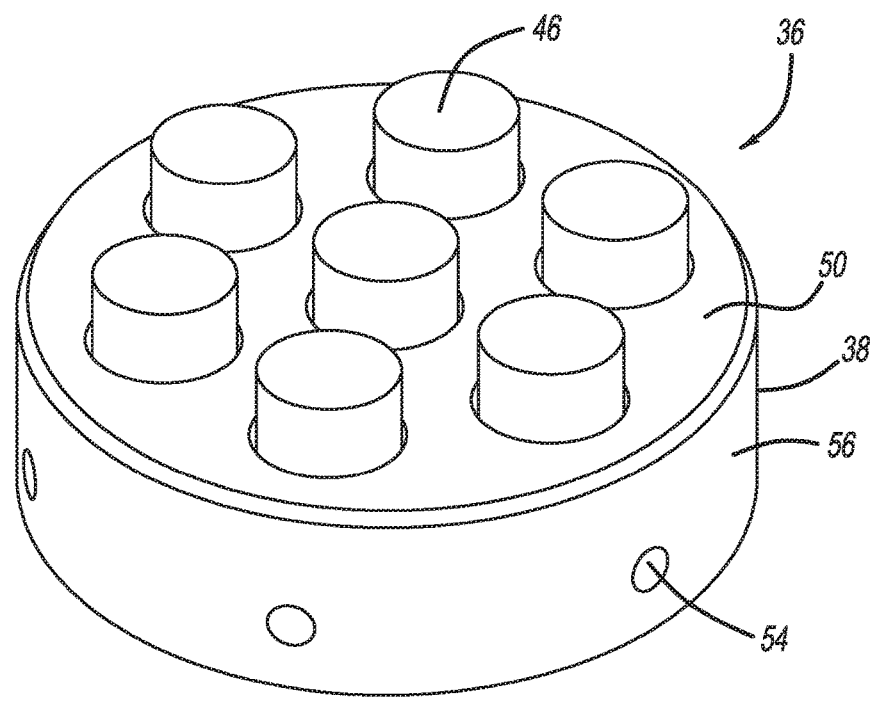
FIG. 3 is an isometric view of the load leveler separated from the press.
Figure 4:
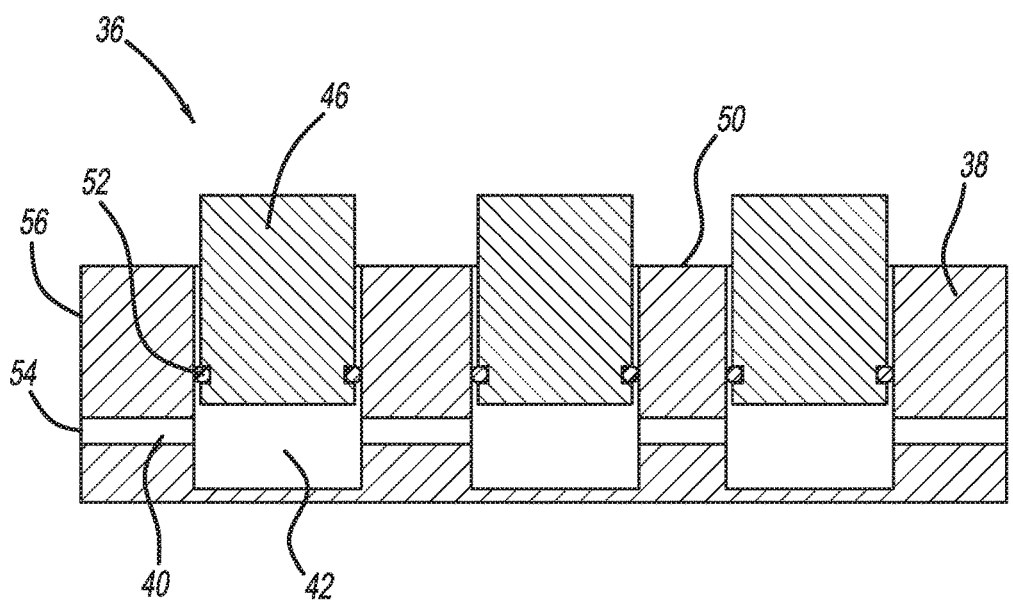
FIG. 4 is a cross-sectional view of the load leveler.

FIG. 3 is an isometric view and FIG. 4 is a cross-sectional view of the load leveler 36 separated from the press 10. The load leveler 36 includes a cylindrical main body 38 having a network of interconnecting fluid channels 40 therein each being in fluid communication with a plurality of piston chambers 42. A separate piston 46 is positioned within each piston chamber 42 and protrudes from a surface 50 of the main body 38. Although seven of the pistons 46 are provided in this design, this is by way of a non-limiting example in that any suitable number of the pistons 46 may be employed in different applications to provide uniform pressure distribution. The pistons 46 are sealed within their corresponding chamber 42 by, for example, an O-ring 52. The network of channels 40 communicates with each piston chamber 42 in such a way that hydraulic fluid is equally provided to a bottom end of each of the pistons 46, and also provided to a reservoir (not shown) of the hydraulic fluid. The hydraulic fluid is a high temperature material that will not decompose under the process heat of the platens 16 and 20. The network of channels 40 includes multiple openings 54 in a side 56 of the main body 38 through which hydraulic fluid can flow to the reservoir.

A mounting end of the main body 38 is mechanically mounted to the frame 12 and a working end of the pistons 46 is in contact with the upper platen 20, as shown in FIGS. 1 and 2. When the press ram 14 moves up to push the platens 16 and 20 together, any unevenness between the platens 16 and 20 is corrected by pushing on the respective piston 46 located at the high position, which transfers the force through the hydraulic fluid to the other pistons 46, which push down on other parts of the platen 20, creating a leveling affect, thus transferring the pressure evenly to the platens 16 and 20 and compensating for any misalignment. Thus, the load leveler 36 provides passive wafer leveling. Since the hydraulic medium cannot compress, each piston 46 is pressure equalized to the opposing platen 20, thus compensating for any degree of surface misalignment or deformation. The main body 38 is shown in an exaggerated deformed configuration in FIG. 2 to show that although this part of the load leveler 36 deforms under the press pressure, the movement of the pistons 46 maintains the platens 16 and 20 perfectly aligned and level with each other.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A press for bonding integrated circuit wafers, chips or substrates, said press comprising:
   a rigid press frame;
   a press ram moveable relative to the press frame;
   a first platen coupled to the press ram;
   a second platen coupled to the press frame; and
   a load leveler coupled between the press frame and the second platen, said load leveler including a main body having a first surface coupled to the press frame and a plurality of pistons extending from the main body through a second surface and being in contact with the second platen, each of the pistons being positioned within a piston chamber that is in fluid communication with a network of channels within the main body, wherein a bonding assembly including the integrated circuit wafers, chips or substrates is mounted to the first or second platen, and wherein the press ram moves the first platen towards the second platen under pressure to bond the integrated circuit wafers, chips or substrates in the bonding assembly together where the pistons move relative to each other through a working fluid within the channels so as to maintain the first and second platens parallel to each other under the ram pressure.

2. The press according to claim 1 wherein the working fluid is a hydraulic fluid.

3. The press according to claim 1 wherein the network of channels includes a plurality of openings through a sidewall of the main body.

4. The press according to claim 1 wherein the plurality of pistons is seven pistons.

5. The press according to claim 1 wherein the main body is a cylindrical body.

6. The press according to claim 1 wherein the first and second platens include heaters for heating the platens.

7. The press according to claim 1 further comprising an insulator positioned between the first platen and the press ram.

8. The press ram according to claim 1 further comprising a hydraulic fluid reservoir providing hydraulic fluid to the press ram.

9. The press according to claim 1 wherein the bonding assembly is a dedicated fixture that holds and aligns the integrated circuit wafers, chips or substrates, or pre-bonded integrated circuit wafers, chips or substrates bonded under low force.

10. A load leveler operable in combination with a press for bonding integrated circuit wafers, chips or substrates together, said load leveler comprising a main body having a first surface operable to be coupled to a press frame and a plurality of pistons extending from the main body through a second surface and being operable to contact a platen of the press, each of the pistons being positioned within a piston chamber that is in fluid communication with a network of channels within the main body so that the pistons move relative to each other through a working fluid within the channels.

11. The load leveler according to claim 10 wherein the working fluid is a hydraulic fluid.

12. The load leveler according to claim 10 wherein the network of channels includes a plurality of openings through a sidewall of the main body.

13. The load leveler according to claim 10 wherein the plurality of pistons is seven pistons.

14. The load leveler according to claim 10 wherein the main body is a cylindrical body.

15. A press for bonding integrated circuit wafers, chips, or substrates, said press comprising:
   a rigid press frame;
   a press ram moveable relative to the press frame;
   a first platen coupled to the press ram;
   a second platen coupled to the press frame, wherein the first and second platens include heaters for heating the platens; and
   a passive load leveler coupled between the press frame and the second platen, said load leveler including a cylindrical main body having a first surface coupled to the press frame and a plurality of pistons extending from the main body through a second surface and being in contact with the second platen, each of the pistons being positioned within a piston chamber that is in fluid communication with a network of channels within the main body, wherein the network of channels includes a plurality of openings through a sidewall of the main body, and wherein a bonding assembly is mounted to the first or second platen, and wherein the press ram moves the first platen towards the second platen under pressure to bond the integrated circuit wafers, chips, or substrates in the bonding assembly together where the pistons move relative to each other through a hydraulic fluid within the channels so as to maintain the first and second platens parallel to each other under the ram pressure.

16. The press according to claim 15 wherein the plurality of pistons is seven pistons.

17. The press according to claim 15 further comprising an insulator positioned between the first platen and the press ram.

18. The press ram according to claim 15 further comprising a hydraulic fluid reservoir providing hydraulic fluid to the press ram.

19. The press according to claim 15 wherein the bonding assembly is a dedicated fixture that holds and aligns the integrated circuit wafers, chips or substrates, or pre-bonded integrated circuit wafers, chips or substrates bonded under low force.

* * * * *